US008378287B2

(12) United States Patent
Schemmann et al.

(10) Patent No.: US 8,378,287 B2
(45) Date of Patent: Feb. 19, 2013

(54) OPTICAL SENSOR MODULE INCLUDING A DIODE LASER AND A SUBSTRATE TRANSPARENT TO RADIATION EMITTED BY THE DIODE LASER AND A METHOD FOR MANUFACTURING AN OPTICAL SENSOR MODULE

(75) Inventors: Marcel Franz Christian Schemmann, Mario Hoop (NL); Armand Pruijmboom, Wijchen (NL); Silvia Maria Booij, Eindhoven (NL); Klaus Peter Werner, Wijchen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 492 days.

(21) Appl. No.: 12/665,124

(22) PCT Filed: Jun. 23, 2008

(86) PCT No.: PCT/IB2008/052480
§ 371 (c)(1),
(2), (4) Date: Dec. 17, 2009

(87) PCT Pub. No.: WO2009/001283
PCT Pub. Date: Dec. 31, 2008

(65) Prior Publication Data
US 2010/0187449 A1    Jul. 29, 2010

(30) Foreign Application Priority Data

Jun. 27, 2007   (EP) .................................... 07111098

(51) Int. Cl.
*G06M 7/00*  (2006.01)
*H01J 5/02*  (2006.01)
(52) U.S. Cl. ....................................... 250/221; 250/239
(58) Field of Classification Search .................. 250/551, 250/221, 239; 345/166–168; 372/29.011, 372/38.01
See application file for complete search history.

(56) References Cited

U.S. PATENT DOCUMENTS 4,764,931 A * 8/1988 Matsuda .................. 372/29.012
5,475,701 A   12/1995 Hibbs-Brenner
(Continued)

FOREIGN PATENT DOCUMENTS

EP   0975072 A2   1/2000
EP   1263098 A1   12/2002
(Continued)

OTHER PUBLICATIONS

Tucker et al: "A Massively Parallel Imaging System Based on the Self-Mixing Effect in a Vertical-Cavity Surface-Emitting Laser Array"; Northern Optics, IEEE, Jun. 2006, pp. 41-45.
(Continued)

*Primary Examiner* — Thanh Luu
(74) *Attorney, Agent, or Firm* — David Zivan; Mark Beloborodov

(57) ABSTRACT

The invention relates to an optical sensor module (1) for a measuring device. Said module comprises at least one optical sensor (2) including a diode laser (3) having a laser cavity for generating a measuring beam, the diode laser being attached to a substrate (12), converging means (5) (such as a lens). During measuring, such converging means (5) converges the measuring beam in an action plane and converges in the laser cavity the measuring beam radiation that has been back-scattered by an object to generate a self-mixing effect and means for measuring the self-mixing effect. Later means comprise a photo diode (4) and an associated signal processing circuitry. According to an essential aspect of the invention, that the diode laser (3) is configured to emit laser radiation of a wavelength for which the substrate (12) being attached to the diode laser (3) is transparent. This configuration leads to an essentially simple (and therefore cheap) sensor module.

10 Claims, 2 Drawing Sheets

U.S. PATENT DOCUMENTS

| | | | |
|---|---|---|---|
| 6,470,753 B2 * | 10/2002 | Maruyama | 73/657 |
| 6,707,027 B2 | 3/2004 | Liess et al. | |
| 6,991,381 B2 | 1/2006 | Kropp | |
| 2003/0109142 A1 | 6/2003 | Cable et al. | |
| 2003/0138009 A1 * | 7/2003 | Weigert et al. | 372/36 |
| 2004/0184495 A1 | 9/2004 | Kondo | |
| 2005/0189473 A1 | 9/2005 | Schrodinger | |
| 2006/0140550 A1 | 6/2006 | Chen et al. | |

FOREIGN PATENT DOCUMENTS

| | | |
|---|---|---|
| JP | 09257421 A | 10/1997 |
| WO | 2006064450 A2 | 6/2006 |
| WO | 2008135903 A2 | 11/2008 |

OTHER PUBLICATIONS

Lim et al: "Distance Measurement Using the Change in Junction Voltage Across a Laser Diode Due to the Self-Mixing Effect"; Northern Optics, IEEE, Jun. 2006, pp. 73-77.

Giuliani et al: "Laser Diode Self-Mixing Technique for Sensing Applications"; Journal of Optics A: Pure and Applied Optics, vol. 4, No. 6, 2002, pp. S283-S294.

Sjolund et al: "Monolithic Integration of Substrate Input/Output Resonant Photodetectors and Vertical-Cavity Lasers"; IEEE Journal of Quantum Electronicsk, vol. 35, No. 7, Jul. 1999, pp. 1015-1023.

* cited by examiner

OPTICAL SENSOR MODULE INCLUDING A DIODE LASER AND A SUBSTRATE TRANSPARENT TO RADIATION EMITTED BY THE DIODE LASER AND A METHOD FOR MANUFACTURING AN OPTICAL SENSOR MODULE

FIELD OF THE INVENTION

The invention relates to an optical sensor module for a measuring device, which module comprises at least one optical sensor including a diode laser having a laser cavity for generating a measuring beam, converging means for converging the measuring beam in an action plane and for converging in the laser cavity measuring beam radiation that has been back-scattered by an object to generate a self-mixing effect and means for measuring the self-mixing effect, which means comprise a photo diode and an associated signal processing circuitry. The invention also relates to a method of manufacturing such optical sensor module. Such a measuring device may be an optical input device that is based on movement of an object and the device with respect to each other, but may also form part of measuring apparatus of different types. The action plane is understood to mean the plane where the radiation receiving and back-scattering surface of the said object is located.

BACKGROUND OF THE INVENTION

An optical input device that uses the self-mixing effect is described in U.S. Pat. No. 6,707,027, which has been filed in the name of Applicant. This document explains the measuring principle and describes several embodiments and applications of the sensor device, which may be included in a computer mouse, for example.

Laser self-mixing occurs if an external reflector, or object, is arranged in front of a diode laser so that an external cavity is obtained. In case of an input device, movement of the device and the object, which may be a human finger or a desk surface, with respect to each other causes tuning of the external cavity. Such tuning results in re-adjustment of the laser equilibrium conditions and thus in detectable changes in the laser output power. These changes, or undulations, are repetitive as a function of the displacement of the object over a distance equal to half the wavelength of the laser radiation. This means that that the frequency of the laser undulations becomes proportional to the speed of the object, i.e. the external reflector. A measuring device based on laser self-mixing shows high sensitivity and accuracy, which can be attributed to the fact that the back-scattered radiation re-entering the laser cavity determines the modulation frequency of the laser radiation and thus is amplified in the laser cavity. The laser acts as a phase sensitive detector and amplifier. In this way high receiver sensitivity is obtained without using additional means like optical filters or complex devices, such as interferometers.

An optical sensor module of this type equipped with two diode lasers allows measurement of movements of the input device, including such a module, and the object with respect to each other in two mutually perpendicular (X- and Y-) directions and any intermediate direction. Although such module can already detect motion in the Z-direction, it is preferred to use a $3^{rd}$ diode laser, as a module having three diode lasers allow a more accurate detection of motion in the Z-direction. This can be achieved by mutually arranging the laser beams such that they are orthogonal or such that they make a 120 degree angle in the detection plane. Such an input device can be used to navigate, or move, a cursor across a display panel, for example to select an icon on the display.

Preferably, the diode laser used in the present input device is a vertical cavity surface emitting laser (VCSEL). The length direction of the laser cavity and the radiation direction of such a laser are perpendicular to its substrate. Compared with the more conventional edge-emitting laser, a VCSEL shows the advantages that it can be fabricated at much smaller size and lower costs and that the cross section of the laser beam is circular, instead of oblong. Moreover the self-mixing effect is considerably stronger in this type of laser.

The concept of the above-described input device has proven to be very worthwhile and an optical computer mouse equipped with such a device has been successfully manufactured and introduced on the market. However, this computer mouse is of the high-end type. In view of its compactness, accuracy and reliability the optical sensor module is also very suitable for low-end computer mice and other mass applications. For such applications the costs of the optical sensor module becomes a main issue in view of the prices of existing devices having lower performance. Thus there is a strong need to reduce the cost of the optical sensor module considerably. Since the number of main elements of the module can not be reduced, cost reduction can only be realised by means of a cheaper manufacturing process.

SUMMARY OF THE INVENTION

It is an object of the present invention to provide an optical sensor module as defined in the first paragraph that can be manufactured at considerably lower cost so that it becomes price-competitive with existing devices having lower performance.

According to the present invention, this sensor module is characterised in that the diode laser is configured to emit laser radiation of a wavelength for which the substrate of the diode laser is transparent.

The present invention is based on the insight that if the substrate is transparent for the laser radiation, the radiation emitted at the rear side of the diode laser can now be used as measuring beam radiation. This allows an inventive re-design of the optical sensor module. This re-design may include several inventive measures, which allow easier and cheaper manufacturing of the sensor module.

Preferably, the optical sensor module is further characterised in that the diode laser emits radiation with a wavelength $\lambda$ between 960 and 980 nm, more preferably of approximately 970 nm. The optical sensor module that is included nowadays in computer mice employs a VCSEL that emits radiation at approximately $\lambda=850$ nm. The substrate of this VCSEL (typically GaAs) is not transparent for this wavelength. As a consequence, in order to obtain a compact module a photo diode or a photo transistor for determining the measuring beam variation should be arranged on the front-side (epi-side) of the substrate. This can be realized for example by integration of the diode or transistor structure in the layers of the VCSEL. However, this complicates, and thus adds cost to the manufacturing process of the module. By employing a laser wavelength according to the invention, both the forward emitted and the backward emitted laser radiation can be used for either the measuring beam or for determining the variation of the measuring beam. This allows a discrete conventional and low-cost photo diode structure to be used.

A practical embodiment of the optical sensor module is further characterised in that it comprises successively in the direction of the emitted measuring beam, a carrier, a photo diode and a VCSEL-type diode laser, the substrate of said diode laser being turned away from the photo diode.

The carrier is understood to mean a base plate upon which the elements of the module are mounted and which comprises connecting elements for electrical connection of the module with external components forming part of a device, for example an input device, wherein the module is to be incorporated. Preferably, this embodiment is further characterised in that the carrier is a printed circuit board.

Such a printed circuit board (PCB) provides flexibility and allows use of upward or downward connecting pins and/or module elements of the SMD (surface mounted device) type.

As is known the optical sensor module comprises an ASIC (application specific integrated circuit) for processing the signal from the photo diode and for controlling the diode laser. In the module of the present invention the ASIC is arranged between the carrier and the photo diode. It is also possible that the photo diode is mounted directly on the carrier and the ASIC is arranged at another location on the carrier. The latter configuration is preferred as it is easier to realise and thus cheaper.

A preferred embodiment of the optical sensor module wherein an inventive use is made of the fact that the upper surface, i.e. the substrate, of the VCSEL is a flat and free surface is characterised in that the converging means are arranged on the substrate side of the diode laser. This means that they are arranged at the location of the emerging beam. Arranging the converging means on the free surface of the VCSEL-substrate provides substantial manufacturing advantages as will be explained later on.

The converging means may be a refractive lens formed of one or more transparent materials, like glass or plastics and having a curved surface. The converging means can be a Fresnel lens which is a thinner version of a normal refractive lens, which is created by dividing a lens into concentric annular sections with discontinuities in between them. The converging means may also be a diffractive element like a grating or a zone plate. Both amplitude and phase gratings can be used. Blazed structures can be used to minimize the loss of light into unwanted orders. Blazing is a well-known technique in diffraction optics and means that the groove geometry is adapted to enlarge the amount of radiation in the required direction or diffraction order at the cost of the radiation in unwanted direction. Blaze can be realised by adapting the slope of the groove walls. A groove with a skew groove wall can be imitated by a groove having different widths at different heights, i.e. a stepped groove, which is easier to manufacture. Thus a preferred embodiment of the optical sensor module is characterised in that the converging means are constituted by a structure of grooves in the substrate surface, which grooves alternate with lands and have a stepped cross section.

The optical sensor module may comprise two or more diode lasers and associated photo diode(s) to measure movements in two or more directions. In principle a single lens per diode laser can be used in the module. A preferred, cost-effective, embodiment of such a module is however characterised in that at least two diode lasers are arranged with respect to a single converging means such that the measuring beams from the diode lasers pass this converging means at different areas. Thus the optical sensor module requires only one converging means, i.e. micro lens, irrespective of the number of diode lasers and measuring beams employed.

The optical sensor module may be further characterised in that the carrier constitutes the base of a module encapsulation, which on the opposite side is closed by a transparent plate. This plate forms a window for the measuring beam(s). Since this window no longer has a lens function, as is the case for the lens cap in the optical sensor module that is now on the market, it is a substantially lower cost element. Inventively, the plate can be used to compensate for the reduction of the undulation frequency, caused by the increased wavelength of the laser radiation. Moreover, this plate increases the Electrostatic Discharge (ESD) blow-up voltage thus preventing destruction at higher voltages and constitutes a mechanical protection for the sensor components. In addition the package should preferably comprise a conductive metal ring in the package base or on top of the package base connected to ground such that any ESD discharge around the in commonly non-conductive plate is conducted to ground without damaging the sensor. Furthermore the transparent plate can partially be made conductive to support conduction of ESD discharges to ground.

Alternatively the optical sensor module, comprising diffraction converging means, may be characterised in that the encapsulation is filled up with a transparent material, which upper side forms the plate. This embodiment is especially attractive when the converging means (either formed as a diffractive or refractive lens) are etched in GaAs substrate and when the moulding material has a smaller refractive index than the substrate material. The moulded transparent material, for example plastics, performs the functions of the transparent plate and is a cheaper alternative for this plate. The carrier (PCB) and encapsulation may be configured such that space is left to include, on demand, additional passive or active components, for example capacitors, so that the sensor module can be adapted to specific applications.

With reference to FIG. 3, the invention also relates to a method 300 of manufacturing an optical sensor module. Said method is characterized in that it comprises the following steps:

Step 302, mass manufacturing on a wafer scale an array of diode lasers,

Step 306, slicing the arrays of diode lasers to obtain diode laser sets having the required number of diode lasers;

Step 308, mass manufacturing on a wafer scale an array of photo diodes corresponding to the array of diode lasers, Step 310, arranging the sets of diode lasers on corresponding sets of photo diodes and fixing the sets together;

Step 312, slicing the array of photodiodes to obtain individual combined diode laser/photo diode sets;

Step 314, combining the sets with one of an array of ICs for processing measured signals and for controlling the diode lasers, which array has been mass-manufactured on a wafer scale, to obtain individual module devices having the required number of diode lasers and photo diodes, and Step 316, mounting a module device on a carrier and encapsulating it.

Preferably, this method is characterised by the intermediate step 304 of providing each set of lasers belonging to one module device with one radiation converging element before slicing the array of lasers. This intermediate step is an essential feature of the invention. The converging elements, i.e. the lens elements of the modules are thus mass-produced, i.e. by means of a wafer-scale process so that these lens elements are very low-cost. For example the refractive micro lenses may be produced by well-known replication or moulding processes. Small drops of lens material may be deposited on the backside of the substrate at the required areas of the laser diode wafer, shaped by means of a mould element and hardened by means of heat or UV radiation. In case of diffraction lenses the grooves may be produced by means of well known lithographic processes.

Preferably the method is further characterised in that the step of fixing the two arrays to each other is performed by means of a flip-chip process. This process is a well-known and low-cost process and has as an additional advantage that this process is self-aligning.

After the sets of diode lasers have been fixed on the corresponding sets of photo diodes of the array, the optical quality of the module devices can be determined by probing these at a (photo diode) wafer scale. In such configuration, the front side of the diode lasers faces the radiation-sensitive areas of the photo diodes and the rear sides of the diode lasers, when in use, face the object to be measured. This probing procedure allows selection of module devices, each comprising diode laser(s), photo diode(s) and a lens element, and mounting only module devices, which have passed the test on ASICs and encapsulating these. In this way the costs of the total yield loss of a module device are limited to the yield losses of VCSEL(s), the photo diode(s) and the lens per se.

The step of combining a set of diode laser(s) photo diode(s) and a lens element with an IC (ASIC) may include arranging the sets with respect to a wafer of ICs, fixing each set to an IC and slicing the IC wafer.

It is also possible to slice firstly the IC wafer and to arrange an individual IC on a carrier. Subsequently a set of laser diode(s), photo diode(s) and lens element can be arranged either on the IC or next to the IC on the carrier. In the latter case care should be taken that the counter electrode of the photo diode can be contacted on the front side. When applying this method, gold metallization at the rear side of the photo diode and at the front side of the IC can be saved.

The invention is also embodied in an input device or in an apparatus wherein such an input device is included, because the sensor module according to the invention allows reducing the costs of the input device and thereby enlarges the field of applications. Apparatuses wherein the input device can be used are, for example, a mouse for a desktop or notebook computer, a notebook computer, a mobile phone, a personal digital assistant (PDA) and a handheld game computer. The invention can also be used in professional measuring apparatuses for measuring, for example, distance to an object or movement of an object, movement of a liquid and movement of particles embedded in a liquid. Generally the invention may be used in applications wherein the laser self-mixing effect is used.

BRIEF DESCRIPTION OF THE DRAWINGS

These and other aspects of the invention will be apparent from and elucidated with reference to the embodiment(s) described hereinafter and to the related drawing, in which FIG. 1 schematically and in cross-section shows an optical sensor module according to the present invention.

It is stressed that for reasons of clarity the various elements of the optical sensor module shown in the Figures are not to scale.

DETAILED DESCRIPTION OF EMBODIMENTS

Figure 1:
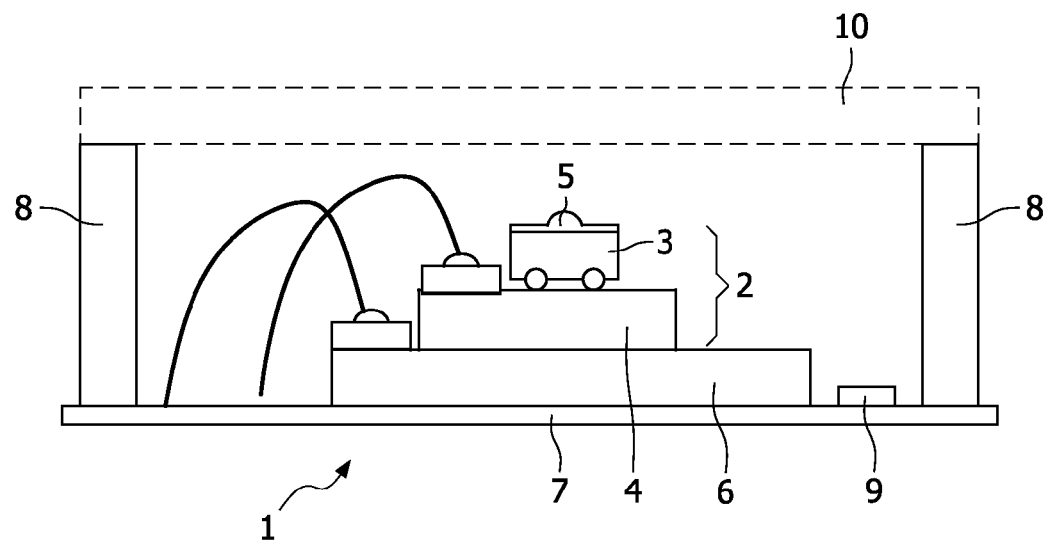

In FIG. 1 an optical sensor module (1) suitable for use in a measuring device is shown in schematic form. Said module comprises an optical sensor (2), which is composed of a diode laser (3) and a photo diode (4), whereby the photo diode (4) actually functions as a carrier for the diode laser (3), which are mutually mechanically and electrically connected. According to a preferred embodiment of the present invention, said diode laser (3) is in the form of a vertical cavity surface emitting laser (VCSEL). As will be detailed by means of FIG. 2, said diode laser (3) of the embodiment shown in FIG. 1 is designed so that it emits two laser beams during working. The photo diode (4) is formed as a silicon pin diode. On the surface of the diode laser (3) facing away from the photo diode (4), converging means (5) in the form of a single micro lens are provided, which converges both laser beams during working of the sensor module and deflects these beams in orthogonal directions. It is noted that the combination of diode laser, photo diode and converging means is often referred to as 'optical engine'.

The optical engine is electrically and mechanically connected to an ASIC (6) via photo diode (4). Said ASIC (6) comprises the required associated signal processing circuitry and is also electrically and mechanically connected to a carrier (7). In the present embodiment, said carrier (7) is formed as a printed circuit board or PCB, which in the configuration shown functions as the bottom part of the encapsulation of the module. Electrical tracks in and on the PCB (not shown) arranges for the required signal output of the sensor to the outside world. Said encapsulation further comprises one or more side walls (8), which can be designed in any required form, and which can be made of a plastic material or of metal. Inside the encapsulation, additional electrical passive components like filter capacitors (9) may be present on the PCB.

In the present embodiment of the invention, the encapsulation of the sensor is also provided with a plate (10), which is transparent to the wavelength of the measuring beams generated by diode laser (3) during working, and which is acting as a window for said beams. In a different embodiment not shown here, said transparent plate (10) has been replaced by a transparent material which fills up the encapsulation. In such embodiment, not only plate (10) but also walls (8) can be omitted from the module.

During the working of the invented optical sensor module, diode laser (3) generates two laser beams which are imaged by means of (a single) converging means (5) to a certain action plane (not shown). On interaction in the action plane, part of the light is back-scattered, which causes self-mixing of the light present in the laser cavity. The photo diode (4) measures this self-mixed light and converts the optical signals into electrical signals. The electrical signals are subsequently transferred to the ASIC (6), in which the necessary signal processing is handled. The resulting signals are fed via the electrical tracks in the PCB to the outside world.

Figure 2:
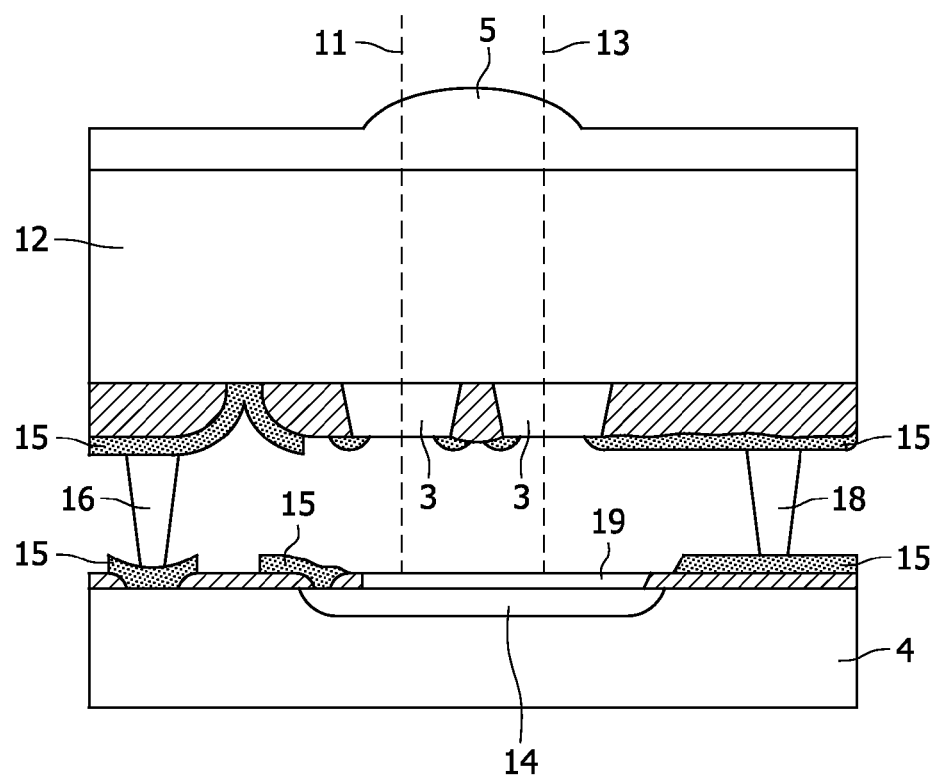
FIG. 2 schematically and in cross-section shows in more detail a part of the optical sensor module according to the present invention.
Figure 3:
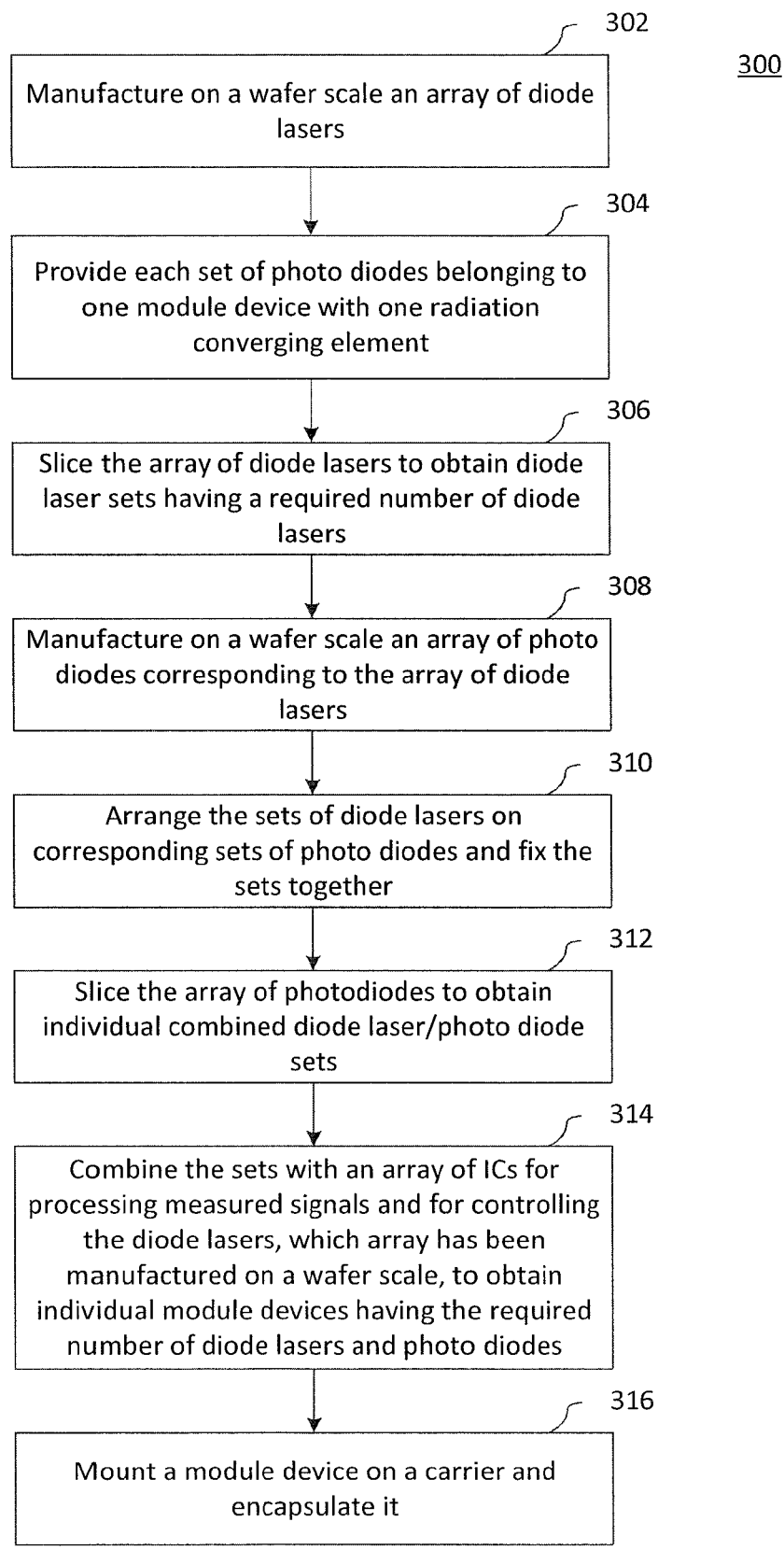
FIG. 3 is a flow diagram of a method of manufacturing the optical sensor module according to the present invention.

In FIG. 2, the optical engine, being composed of two diode lasers (3), a single photo diode (4) and converging means (5) is schematically shown in more detail. The diode laser (3) comprises a multilayer of epitaxially grown layers of GaAs, $Al_xGa_{1-x}As$ and $In_yGa_{1-y}As$ ($0<=x$, $y<=1$) on a monocrystalline substrate (12) of GaAs. The outer parts of the multilayer act as a mirror, whereas in the middle part of the multilayer a laser beam is generated during its working. According to an essential element of the invention, the thicknesses and the compositions of the layers has been chosen such that the generated laser radiation has a wavelength for which the substrate (12) is transparent. In the here described embodiment, this means that the wavelength of the laser radiation is longer than approximately 950 nm. Monocrystalline GaAs is transparent for radiation of this wavelength.

In addition, the laser radiation should preferably be detectable with a low-cost silicon detector used as the photo diode (4). Wavelengths up to 990 nm satisfy this requirement. Furthermore the strain required to manufacture the active layer of the VCSEL should be considered. A VCSEL laser has a very short cavity and requires multiple quantum wells to provide the optical gain required for a laser to work. Each quantum well layer is strained such that the total strain can lead to defects that compromise the device lifetime. In contrast to widely used edge-emitting devices that operate at 980 nm and only require a single (or sometimes two) quantum well the amount of strain in the VCSEL active layer should preferably be reduced. For this reason a wavelength of approximately 970 nm is preferred because at this shorter wavelength the active layer strain is lower. It should furthermore be realized that for efficient self-mixing and high photodiode current the reflectivity of the laser mirrors should be relatively low (such that a large number of photons is emitted and can be received back in the laser cavity). This in turn required a large gain from the active layer to achieve lasing threshold and that can require additional quantum wells. For this reason the preferred wavelength of the laser is chosen such that the substrate is transparent (above 960 nm) and the active layer strain is controlled (up to 980 nm) and the wavelength is efficiently detectable by a Si detector. It should also be recognized that the invention also includes use of alternate substrates that allow transparency at shorter wavelength or even the removal of the substrate such that transparency at shorter wavelengths is available.

The generated laser beam can only emerge from the two lasers (3) at two specific locations. These two laser beams are schematically indicated in FIG. 2 by dotted lines (11) and (13). After the generation of the two measuring laser beams in the cavities of the diode laser (3), they pass through substrate (12) and emerge via the single converging means (5), being designed in the form of a micro lens. After interaction, part of the radiation is back-scattered into the respective diode lasers (3) where this radiation mixes with the there generated laser light. This mixing causes light intensity fluctuations of the emitted laser light, which fluctuations are measured via photo sensitive area (14) of photo diode (4). This photo sensitive area (14) should preferably be larger than the beam width. In the photo diode (4) the optical signals received on the sensitive area's (14, 15) are converted into electrical signals, which are brought to the outside world via electrically conductive paths (15). For optimising the measurements, an anti reflective layer (19) is provided on the surface of the photo sensitive area (14).

FIG. 2 also shows that the diode laser structure is flip chip bound to the photo diode (4). In this bonding configuration, said structure is connected via conductive metallic studs (16, 18) to the photo diode (4). These studs both provide electrical connections as well as heat sinks in order to prevent overheating of the VCSEL diode lasers (3). There are ohmic contacts between the studs (16) resp (18) and the cathode resp the anode of the VCSEL diode lasers (3).

The above-described laser sensor module has been manufactured via the following inventive method In a preferred manufacturing method photodiode wafers or wafer sections are manufactured with solder bumps deposited on these photo detector wafers. Secondly VCSEL wafers are manufactured and these are provided with optical converging means on the substrate side such as lenses. These VCSEL wafers are diced and separated into laser dies (that each include optical diffractive means). These dies are placed on the solder bumps of the photo diode wafer (section). Subsequently these contacting parts are soldered together so as to obtain diode laser/photo diode sets.

As indicated before, the provision of the converging means on the free surface of the substrate of the diode laser is an essential part of the present invention. These converging means can be made either directly in the substrate surface or on the substrate surface. Converging means in the substrate are realized via etching in the GaAs substrate, which is in itself a rather expensive procedure. Converging means on the free substrate are realized by means of provision of a replicating process (with a UV curable lacquer resin) or a printing process. Especially interesting is the process in which a glass wafer with predefined lens structures are applied on the GaAs substrate. In order to obtain optimal results, it is preferred to polish said free surface. In order to reduce undesirable internal reflections on the interface between the lenses and the GaAs substrate, an anti-reflective coating is preferably applied.

In a preferred method the testing of the opto-electronic properties of the diode laser/photo diode is performed on the photo detector wafer level. This allows use of low-cost wafer level probing equipment to test all critical parameters and eliminates most test requirements in other process steps. It is an object of the invention to eliminate such test steps on VSEL wafer and on assembled product level. It is a further object of the invention to use small metal pads on the VCSEL that must allow soldering but need not allow bonding or probing. This leads to a reduction in VCSEL die size and thus a significant cost reduction can be achieved. The photo detector wafer or die is used as a carrier for the small VCSEL that allows testing and bonding. The photo detector wafer is then diced into separate detector/laser/lens units which can be mounted into a package and connected to an ASIC for form a complete laser sensor module.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. Optical sensor module for a measuring device, which module comprises at least one optical sensor including a diode laser having a laser cavity for generating a measuring beam, the diode laser being attached to a substrate, converging means for converging the measuring beam in an action plane and for converging in the laser cavity measuring beam radiation that has been back-scattered by an object to generate a self-mixing effect and means for measuring the self-mixing effect, which means comprise a photo diode and an associated signal processing circuitry, wherein the diode laser is configured to emit laser radiation through said substrate, said laser radiation having a wavelength for which the substrate being attached to the diode laser is transparent, said converging means being arranged on a side of the substrate and the diode laser being attached to the other side of the substrate, said photo diode functioning as a carrier for said diode laser, said diode laser and said photo diode being mutually mechanically and electrically connected.

2. Optical sensor module according to claim 1, comprising successively in the direction of the emitted measuring beam, a carrier, the photo diode and a Vertical Cavity Surface Emitting Laser (VCSEL)-type diode laser, the substrate being attached to the diode laser being turned away from the photo diode.

3. Optical sensor module according to claim 1, wherein at least two diode lasers are arranged with respect to a single converging means such that the measuring beams from the diode lasers pass this converging means at different areas.

4. Optical sensor module according to claim 1, wherein the sensor module further comprises a base of a module encapsulation, which on the opposite side of the sensor module is closed by a transparent plate.

5. Optical sensor module according to claim 4, wherein the converging means are diffraction converging means, wherein the encapsulation is filled up with a transparent material and wherein an upper side of the transparent material forms the transparent plate.

6. A method of manufacturing an optical sensor module, wherein the method comprises the following steps:
 manufacturing on a wafer scale an array of diode lasers,
 slicing the array of diode lasers to obtain diode laser sets having a required number of diode lasers;
 manufacturing on a wafer scale an array of photo diodes corresponding to the array of diode lasers,
 arranging the sets of diode lasers on corresponding sets of photo diodes and fixing the sets together, wherein a first side of each of said diode lasers arranged on the corresponding sets of photo diodes includes a respective substrate and wherein said fixing comprises fixing second sides of the sets of diode lasers that oppose said first sides to said sets of photo diodes;
 slicing the array of photodiodes to obtain individual combined diode laser/photo diode sets;
 combining the sets with one of an array of integrated circuits for processing measured signals and for controlling the diode lasers, wherein said array of integrated circuits has been manufactured on a wafer scale, to obtain individual module devices having the required number of diode lasers and photo diodes, and
 mounting one of said module devices on a carrier and encapsulating the one of said module devices.

7. Method according to claim 6, comprising an intermediate step of providing each set of photo diodes belonging to one module device with one radiation converging element before slicing the array of photo diodes.

8. Method according to claim 6, wherein said fixing comprises fixing said sets of diode lasers to said sets of photo diodes such that each of said diode lasers of said sets of diode lasers is disposed directly above a corresponding photo diode of the sets of photo diodes.

9. Method according to claim 6, wherein said fixing comprises fixing said sets of diode lasers to said sets of photo diodes such that each of said diode lasers of said sets of diode lasers is mutually mechanically and electrically connected to a corresponding photo diode of the sets of photo diodes.

10. Optical sensor module for a measuring device, which module comprises at least one optical sensor including at least two diode lasers having laser cavities for generating measuring beams, the diode lasers being attached to a substrate, converging means for converging the measuring beams in an action plane and for converging in the laser cavities measuring beam radiation that has been back-scattered by an object to generate a self-mixing effect and means for measuring the self-mixing effect, which means comprise a photo diode and an associated signal processing circuitry, wherein the diode lasers are configured to emit laser radiation through said substrate, said laser radiation having a wavelength for which the substrate being attached to the diode lasers is transparent, said converging means being arranged on a side of the substrate and the diode lasers being attached to an other side of the substrate, said photo diode functioning as a carrier for said diode lasers, said diode lasers and said photo diode being mutually mechanically and electrically connected, wherein the converging means is a single converging means and wherein the at least two diode lasers are arranged with respect to the single converging means such that the measuring beams from the diode lasers pass the single converging means.

* * * * *